United States Patent
Cha et al.

(10) Patent No.: US 11,532,572 B2
(45) Date of Patent: Dec. 20, 2022

(54) SEMICONDUCTOR PACKAGE

(71) Applicant: SAMSUNG ELECTRONICS CO., LTD., Suwon-si (KR)

(72) Inventors: Yoo Rim Cha, Suwon-si (KR); Joo Hwan Jung, Suwon-si (KR); Jung Chul Gong, Suwon-si (KR); Yong Ho Baek, Suwon-si (KR); Young Sik Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/357,542

(22) Filed: Jun. 24, 2021

(65) Prior Publication Data

US 2021/0327832 A1 Oct. 21, 2021

Related U.S. Application Data

(63) Continuation of application No. 16/285,606, filed on Feb. 26, 2019, now Pat. No. 11,075,175.

(30) Foreign Application Priority Data

Aug. 10, 2018 (KR) .................. 10-2018-0093707

(51) Int. Cl.
*H01L 23/64* (2006.01)
*H01L 23/13* (2006.01)
*H01L 23/498* (2006.01)

(52) U.S. Cl.
CPC ............ *H01L 23/645* (2013.01); *H01L 23/13* (2013.01); *H01L 23/49822* (2013.01); *H01L 23/642* (2013.01)

(58) Field of Classification Search
CPC ..... H01L 23/13; H01L 23/642; H01L 23/645; H01L 23/49822
USPC .......................................... 257/668
See application file for complete search history.

(56) References Cited

U.S. PATENT DOCUMENTS

| | | | |
|---|---|---|---|
| 8,624,376 B1 | 1/2014 | Chen | |
| 9,853,003 B1 | 12/2017 | Han | |
| 10,083,929 B2* | 9/2018 | Choi | ............ H01L 24/20 |
| 2006/0131724 A1 | 6/2006 | Sato et al. | |
| 2011/0062549 A1 | 5/2011 | Lin | |
| 2014/0076617 A1 | 3/2014 | Chen | |
| 2018/0053036 A1 | 2/2018 | Baek et al. | |

(Continued)

FOREIGN PATENT DOCUMENTS

| | | |
|---|---|---|
| KR | 10-2006-0071346 A | 6/2006 |
| KR | 10-2018-0012187 A | 2/2018 |

(Continued)

OTHER PUBLICATIONS

Communication dated Sep. 26, 2019, issued by the Korean Intellectual Property Office in counterpart Korean Patent Application No. 10-2018-0093707.

(Continued)

*Primary Examiner* — Monica D Harrison
(74) *Attorney, Agent, or Firm* — Sughrue Mion, PLLC

(57) ABSTRACT

A semiconductor package includes a connection member including an insulating layer and a redistribution layer, a semiconductor chip disposed on the connection member, and an inductance sensing part having a coil form and electrically connected to the semiconductor chip.

20 Claims, 12 Drawing Sheets

(56) References Cited

U.S. PATENT DOCUMENTS

| | | |
|---|---|---|
| 2018/0130673 A1 | 5/2018 | Hwang et al. |
| 2018/0174994 A1 | 6/2018 | Choi et al. |
| 2018/0182704 A1 | 6/2018 | Yeh |
| 2018/0315706 A1 | 11/2018 | Liao |

FOREIGN PATENT DOCUMENTS

| | | |
|---|---|---|
| KR | 10-2018-0021629 A | 3/2018 |
| KR | 10-2018-0070279 A1 | 6/2018 |
| TW | 201117686 A1 | 5/2011 |
| TW | 201733417 A | 9/2017 |
| TW | 201816969 A | 5/2018 |

OTHER PUBLICATIONS

Communication dated Dec. 26, 2019, issued by the Taiwanese Patent Office in counterpart Taiwanese Patent Application No. 108106189.

* cited by examiner

SEMICONDUCTOR PACKAGE

CROSS-REFERENCE TO RELATED APPLICATION(S)

This application is a continuation of U.S. application Ser. No. 16/285,606, filed Feb. 26, 2019, which claims benefit of priority to Korean Patent Application No. 10-2018-0093707 filed on Aug. 10, 2018 in the Korean Intellectual Property Office, the disclosure of which are incorporated herein by reference in their entireties.

TECHNICAL FIELD

The present disclosure relates to a semiconductor package, and more particularly, to a semiconductor package in which electrical connection structures may extend outwardly of a region in which a semiconductor chip is disposed.

BACKGROUND

One of recent major trends in development of semiconductor chip technology is to reduce a size of a component. As a result, a semiconductor package is required to have a compact size, and, at the same time, implement a plurality of pins in accordance with a rapid increase in demand for a compact semiconductor chip, and the like, even in the field of package technology.

One type of semiconductor package technology suggested to satisfy the technical demand described above, is a fan-out semiconductor package. Such a fan-out package has a compact size and may allow a plurality of pins to be implemented by redistributing connection terminal outwardly of a region in which a semiconductor chip is disposed.

Such a semiconductor package may be applied to electronic devices such as a smartphone, a tablet PC, a smartwatch, and the like to perform various functions.

SUMMARY

An aspect of the present disclosure may provide a semiconductor package having an inductance sensing function to improve sensitivity.

According to an aspect of the present disclosure, a semiconductor package may include: a connection member including an insulating layer and a redistribution layer; a semiconductor chip disposed on the connection member; and an inductance sensing part having a coil form and electrically connected to the semiconductor chip.

The inductance sensing part may be disposed in the connection member.

The inductance sensing part may be disposed on the same level as a level on which the redistribution layer is disposed.

The inductance sensing part may have a single-layer coil structure.

The inductance sensing part may be disposed not to overlap the semiconductor chip in a thickness direction of the insulating layer.

The inductance sensing part may overlap the semiconductor chip in a thickness direction of the insulating layer.

The inductance sensing part may be electrically connected to a capacitor in the semiconductor chip.

The inductance sensing part may include a plurality of coils.

The plurality of coils may be electrically separated from each other.

The plurality of coils may be connected to a plurality of capacitors in the semiconductor chip, respectively.

Directions of turns of the plurality of coils may be different from each other.

The semiconductor package may further include a core member having a through-hole in which the semiconductor chip is accommodated, wherein the inductance sensing part is disposed in the core member.

The inductance sensing part may have a multilayer coil structure.

The core member may include a plurality of insulating layers stacked on each other, and the coil form of the inductance sensing part may be in physical contact with one or more of the plurality of insulating layers of the core member.

The semiconductor package may further include a capacitor disposed adjacent to the semiconductor chip, wherein the inductance sensing part is electrically connected to the capacitor.

The semiconductor package may further include an encapsulant protecting the semiconductor chip, wherein the semiconductor chip is disposed so that an active surface of the semiconductor chip faces the connection member.

The semiconductor package may further include an external electrical connection unit penetrating through the encapsulant and electrically connected to the redistribution layer.

The inductance sensing part and the encapsulant may be spaced apart from each other.

The coil form of the inductance sensing part may be in physical contact with the insulating layer of the connection member.

The coil form of the inductance sensing part may be wound in a stacking direction along which the insulating layer and the redistribution layer of the connection member are stacked.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

Electronic Device

Figure 1:
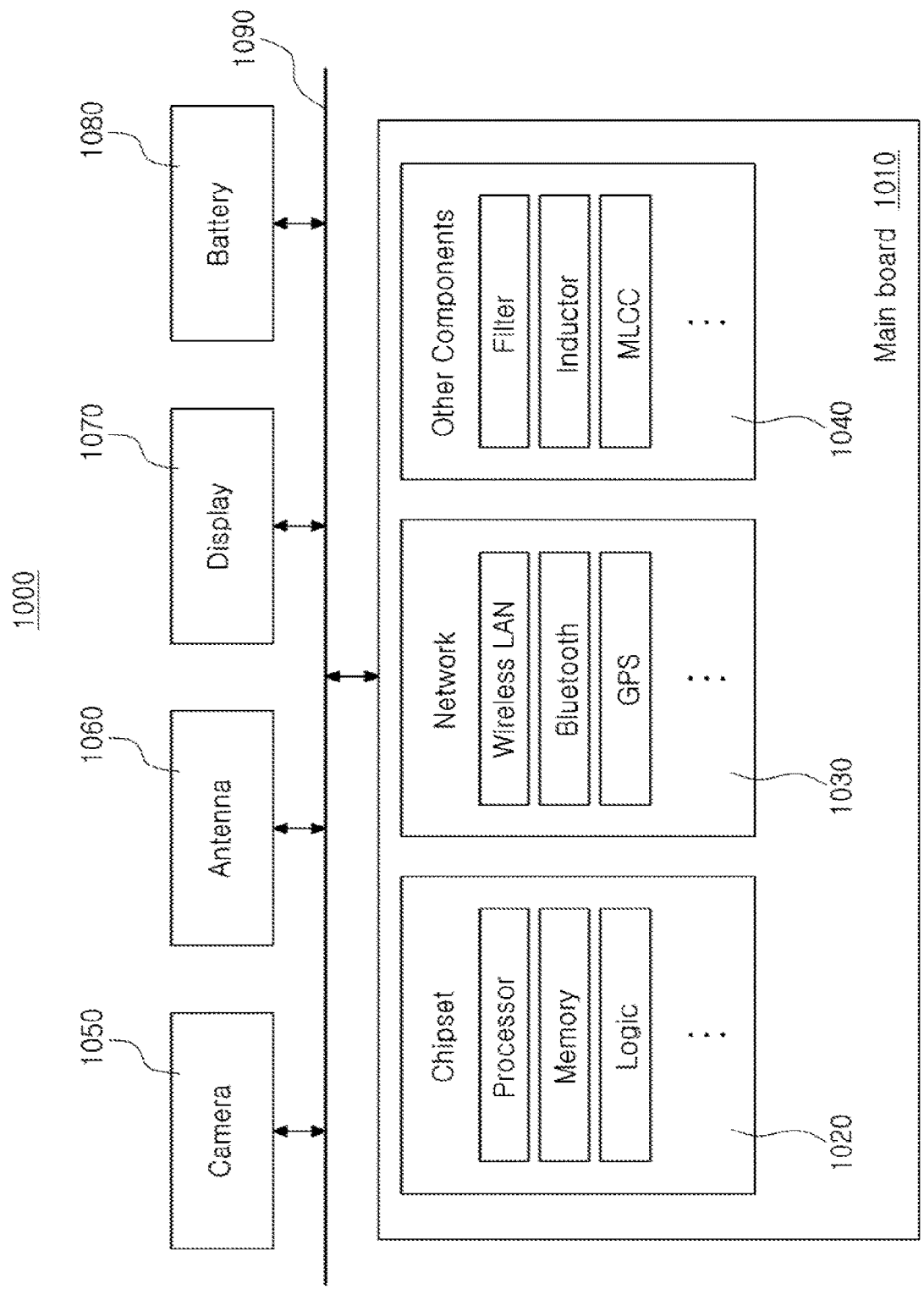
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
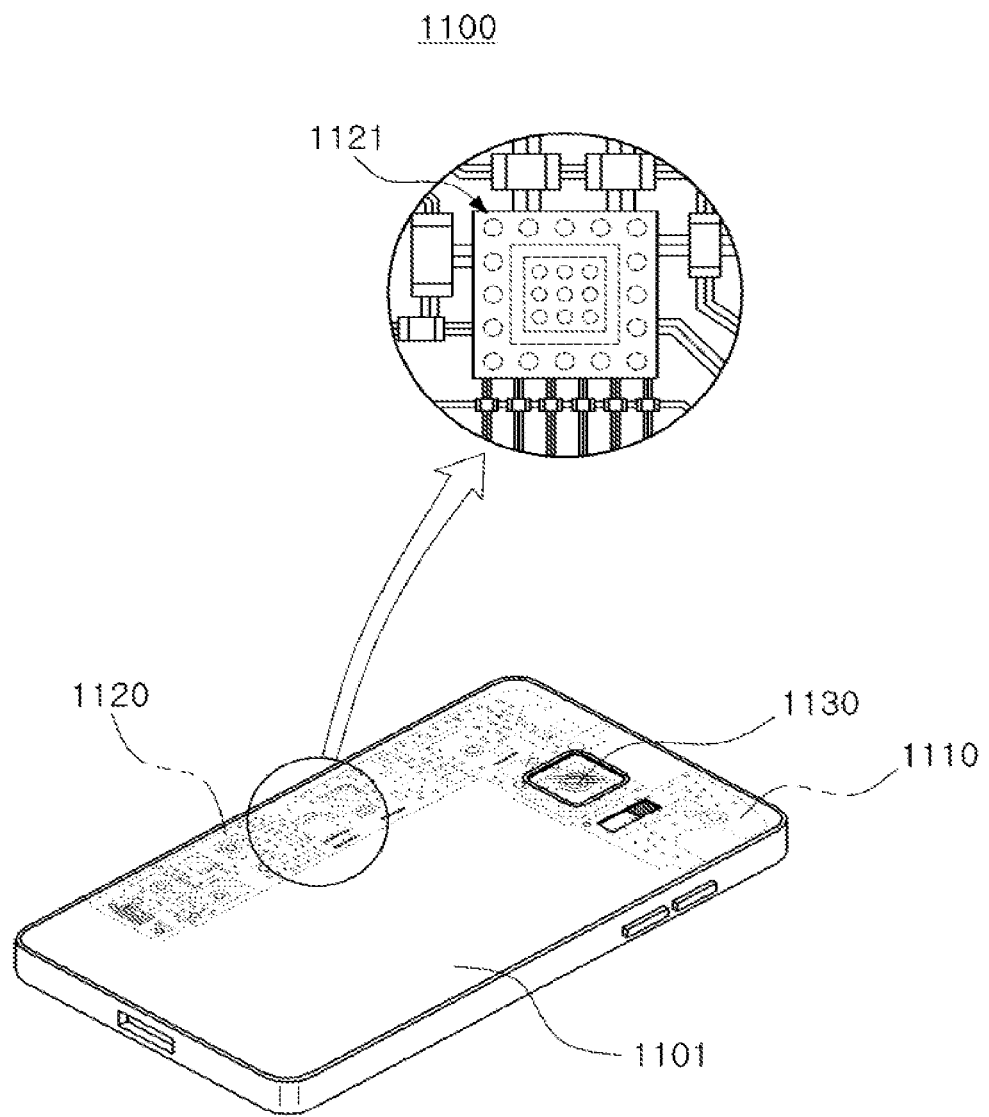
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
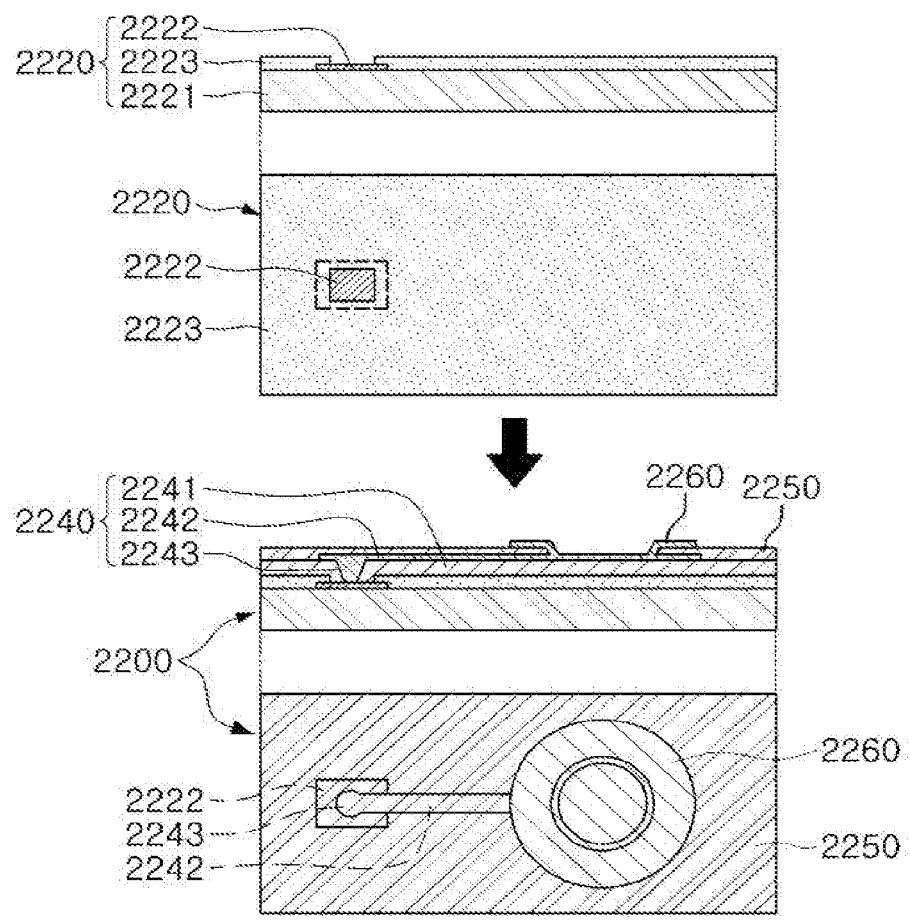
FIGS. 3A and 3B are schematic cross-sectional views illustrating states of a fan-in semiconductor package before and after being packaged.
Figure 3B:
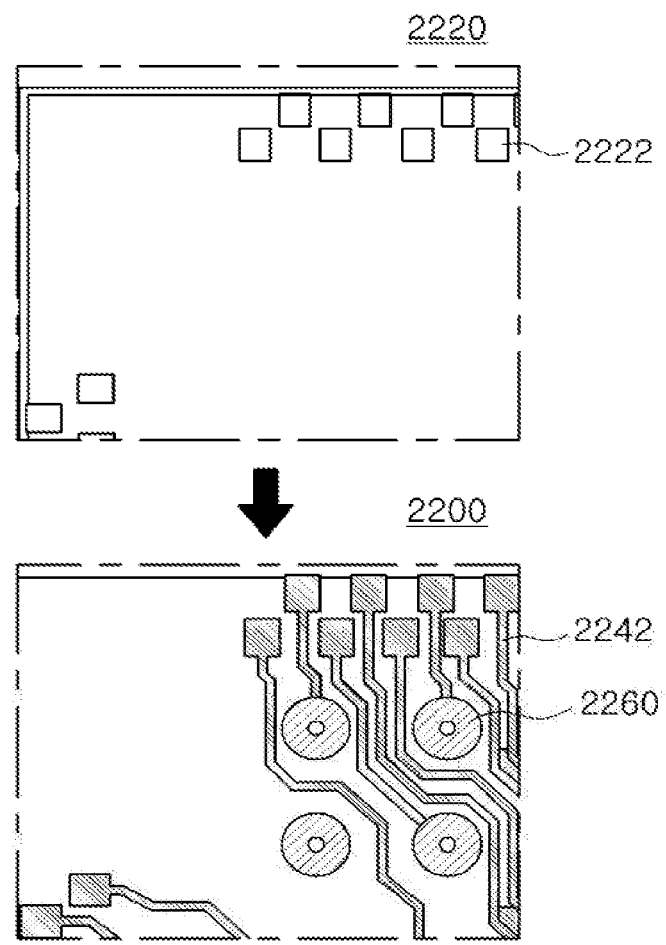

FIGS. 3A and 3B are schematic cross-sectional views illustrating states of a fan-in semiconductor package before and after being packaged.

Figure 4:
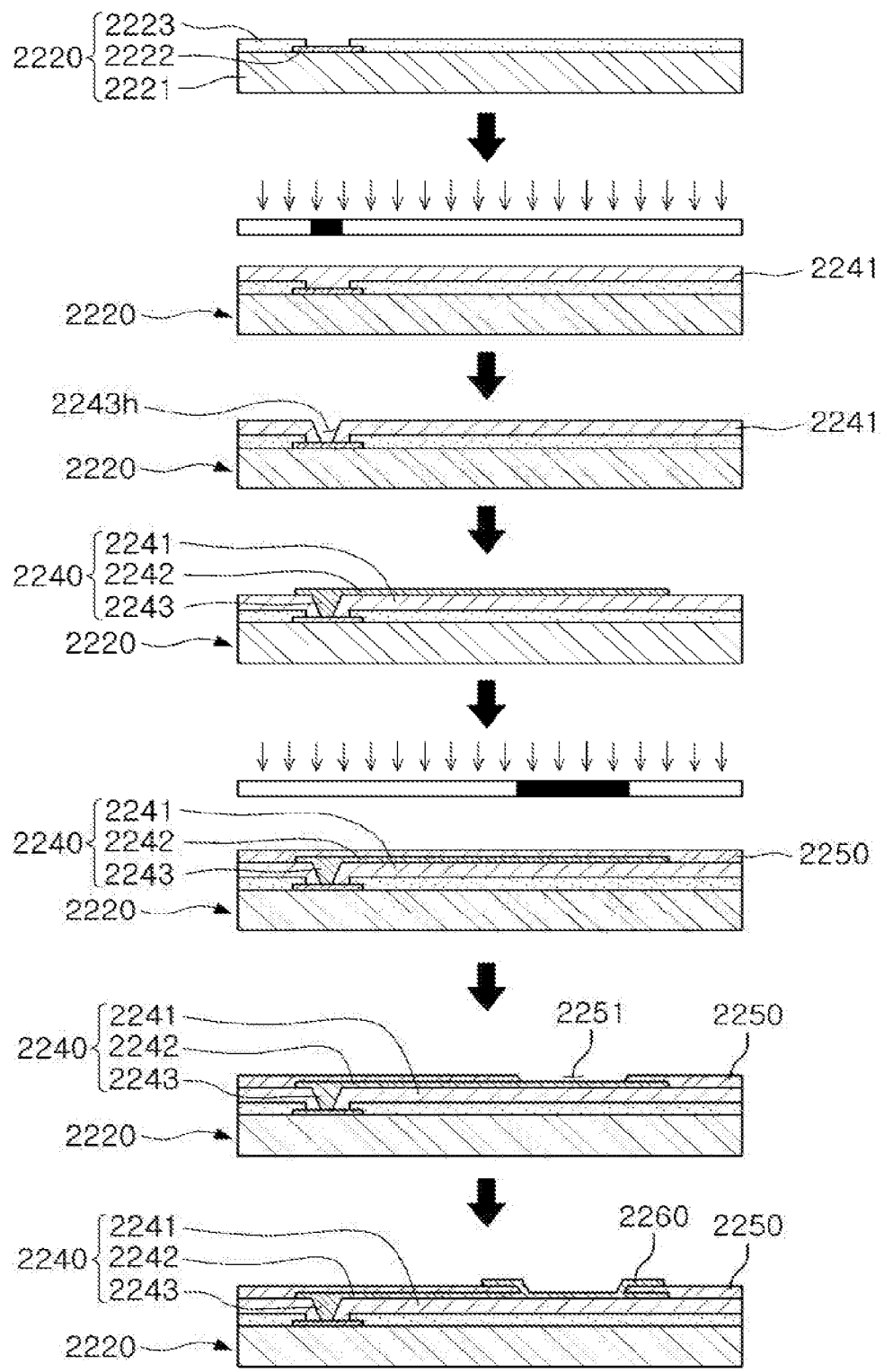
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 224 on the semiconductor chip 2220 using an insulating material such as a photoimagable dielectric (PID)) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
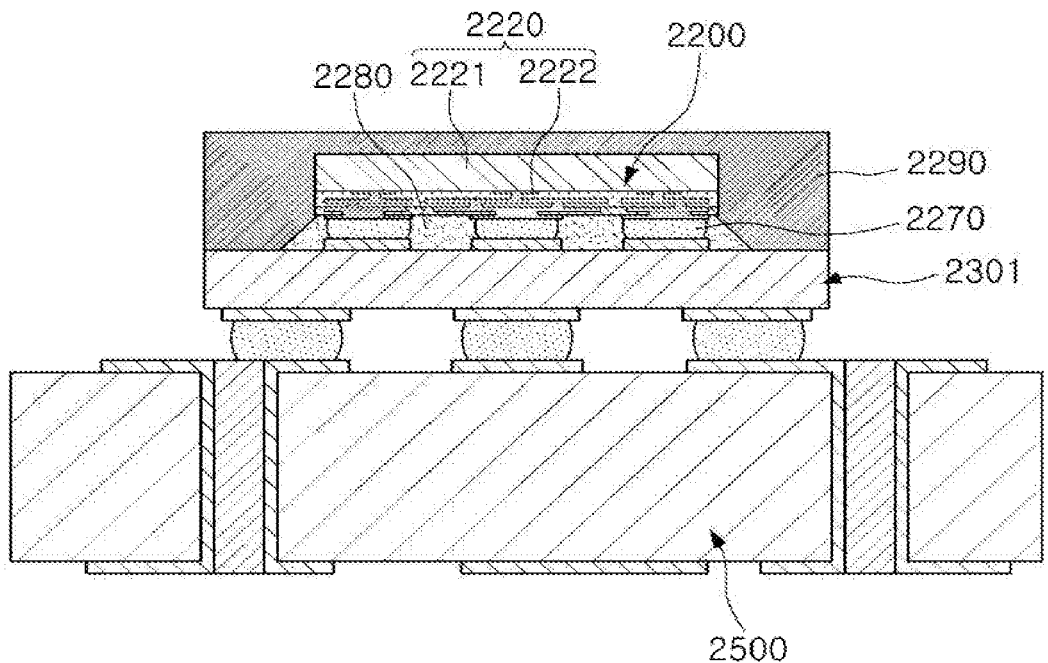
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
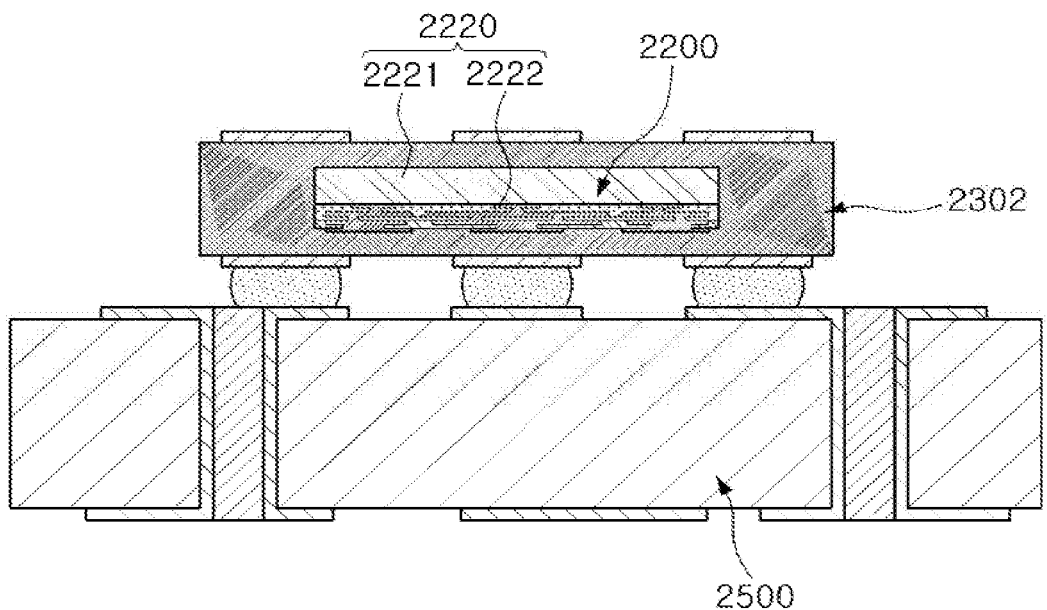
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer s-ide of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
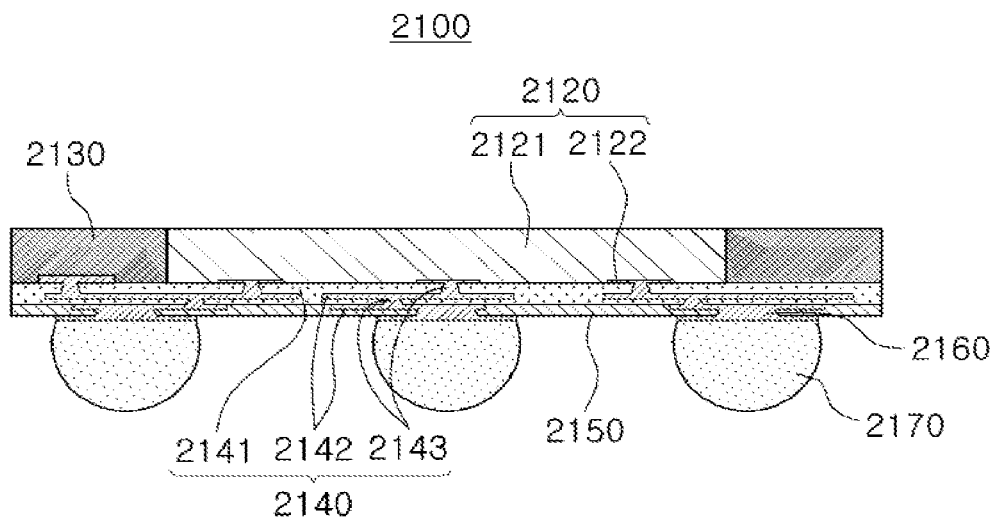
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
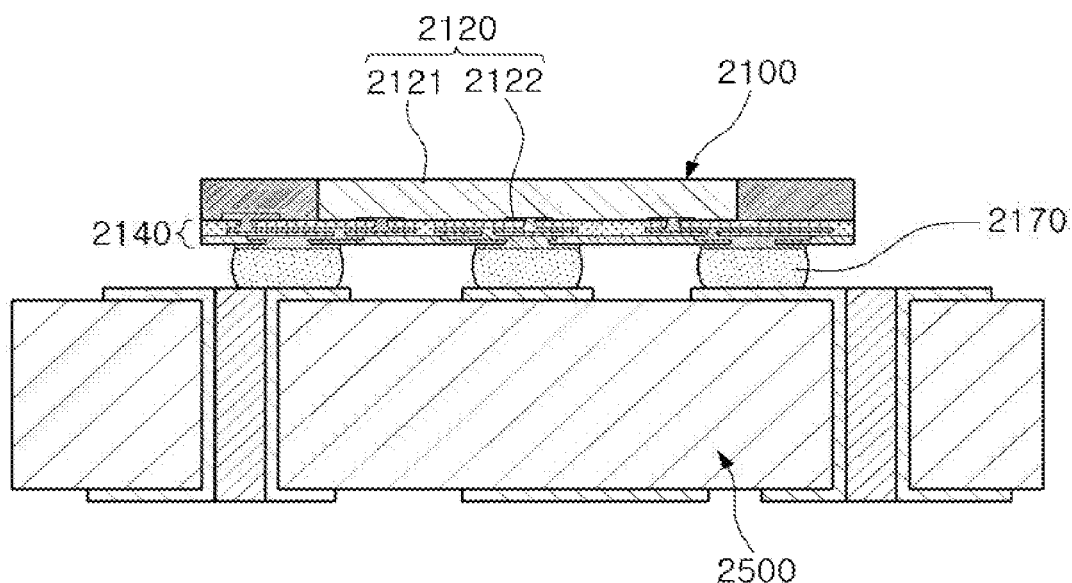
FIG. 8 is a schematic cross-sectional view illustrating a case in which a tan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (POB) such as an interposer substrate, or the like, having a scale, a purpose, and the like, different from those of the fan-out semiconductor package, and having the fan-in semiconductor package embedded therein.

Fan-out semiconductor packages according to exemplary embodiments in the present disclosure will hereinafter be described with reference to the drawings. However, the present disclosure is not limited to the fan-out semiconductor package, but may be applied to semiconductor packages in other forms.

Figure 9:
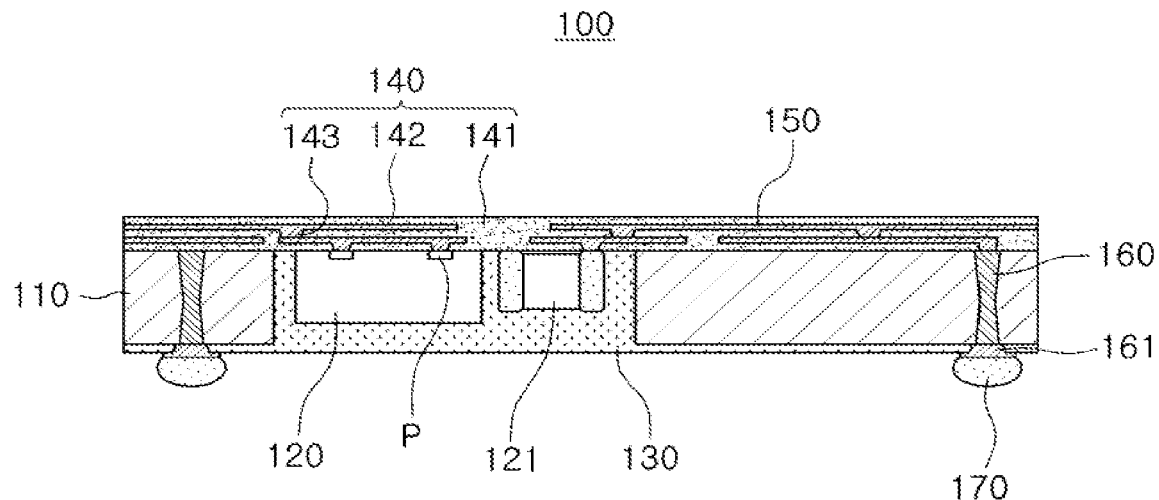
FIG. 9 is a schematic cross-sectional view illustrating a semiconductor package according to an exemplary embodiment in the present disclosure.
Figure 10:
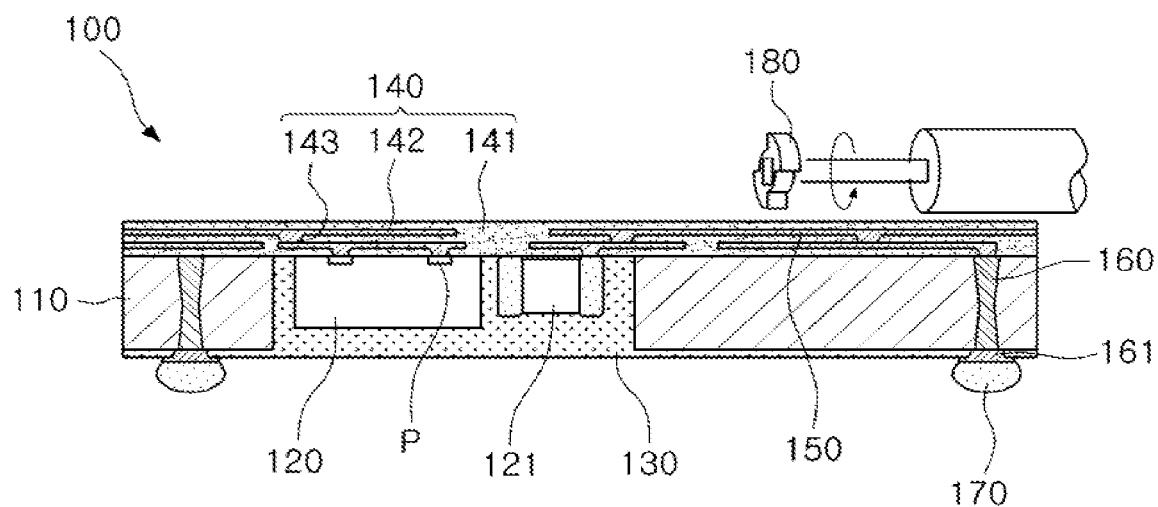
FIG. 10 illustrates an example of an operation of the semiconductor package of FIG. 9.

FIG. 9 is a schematic cross-sectional view illustrating a semiconductor package according to an exemplary embodiment in the present disclosure. FIG. 10 illustrates art example of an operation of the semiconductor package of FIG. 9. Further, FIGS. 11 through 14 are plan views of an inductance sensing part when viewed from the top.

Referring to the drawings, a semiconductor package 100 according to an exemplary embodiment may include a core member 110, a semiconductor chip 120, an encapsulant 130, and a connection member 140, and an inductance sensing part 150 may be disposed in the connection member 140. In addition, the semiconductor package 100 may further include conductive vias 161, electrical connection structures 170, and the like as external electrical connection units.

The core member 110 may improve rigidity of the semiconductor package 100, and serve to secure uniformity in thickness of the encapsulant 130. In the exemplary embodiment, the core member 110 may include a through-hole, and the semiconductor chip 120 may be disposed in the through-hole. Further, the semiconductor package 100 may include passive devices 131 and 122 such as a capacitor, an inductor, and the like, if necessary. The core member 110 may be omitted, if necessary, but it may be more advantageous in securing board level reliability that the semiconductor package 100 includes the core member 110.

The core member 110 may include an insulating layer and a material of the core member 110 may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABE), FR-4, Bismaleimide Triazine (ST), or the like. The core member 110 may serve as a support member. In addition, the core member 110 may include conductive vias 160 penetrating through the insulating layer to form a wiring structure disposed at an upper portion and a lower portion of the core member 110.

The semiconductor chip 120 may be disposed so that an active surface, that is, a surface in which connection pads P are disposed to face the connection member, and may be an integrated circuit (IC) in which several hundreds to several millions of elements or more are integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body of the semiconductor chip 120 may be silicon (Si), germanium (Ge), gallium arsenide (GaAs), or the like. Various circuits may be formed on the body. The connection pads P may electrically connect the semiconductor chip 120 to other components. A material of each of the connection pads 120P may be a conductive material such as aluminum (Al), or the like. The semiconductor chip 120 may be a bare die, a redistribution layer (not illustrated), may further be formed on the active surface of the semiconductor chip 120, if necessary, and bumps (not illustrated), or the like, may be connected to the connection pads P. The semiconductor chip 120 may be the same kind of chips or may be different kinds of chips. Further, an example in which one semiconductor chip 120 is used is described in the exemplary embodiment, but the number of semiconductor chips 120 may be two or more.

The encapsulant 130 may protect the core member 110, the semiconductor chip 120, the passive devices 121 and 122, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover the core member 110, an inactive surface of the semiconductor chip 120, the passive devices 121 and 122, and the like, and fill spaces between walls of the though-hole of the core member 110 and side surfaces of the semiconductor chip 120 and the passive devices 121 and 122. The encapsulant 130 may fill the through-hole to thus serve as an adhesive and reduce buckling of the semiconductor chip 120 depending on certain materials.

When the inductance sensing part 150 is disposed in the connection member 140 and the external electrical connection units 161 and 170 electrically connected to redistribution layers 142 are disposed at a lower portion in FIG. 9 as in the exemplary embodiment, the conductive vias 161 penetrating through the encapsulant 130 may be provided. The conductive vias 161 may be connected to the electrical connection structures 170 such as solder balls, or the like. However, in the exemplary embodiment, the encapsulant 130 may not be a necessarily required component, and may not be used in some cases or may be replaced with another component.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT, or the like. A photoimagable dielectric (PID) resin may also be used, if necessary.

The connection member 140 may redistribute the connection pads P of the semiconductor chip 220. Several tens to several hundreds of connection pads P of the semiconductor chip 120 having various functions may be redistributed by the connection member 140, and may be physically or electrically externally connected through the electrical connection structures 170 depending on functions. To this end, the connection member 140 may include the redistribution layers 142. As an example, the connection member 140 may include a plurality of insulating layers 141 disposed on the core member 110 and the active surface of the semiconductor chip 120, the redistribution layers 142, and conductive vias 143 connecting the redistribution layers 142 to each other. The redistribution layers 142 may be electrically connected to the connection pads P of the semiconductor chip 120. However, the numbers of redistribution layers 142, insulating layers 141, and conductive vias 143 may be changed, if necessary.

An insulating material included in the insulating layer 141 may be, for example, a photosensitive insulating material. When the insulating layer 141 has photosensitive properties, the insulating layer 141 may be formed to have a smaller thickness, and a fine pitch of the conductive vias 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent. The number of insulating layers 141 may be more than that illustrated in the drawings.

The redistribution layers 142 may serve to redistribute the connection pads P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like. In addition, the redistribution layers 142 may include via pad patterns, connection terminal pad patterns, and the like.

The conductive vias 143 may electrically connect the redistribution layers 142, the connection pads P, or the like, formed on different layers to each other, resulting in an electrical path in the semiconductor package 100. A material of each of the conductive vias 143 may be a conductive material such as copper (Cu), aluminum (Al), silver (Ag), tin (Sn), gold (Au), nickel (Ni), lead (Pb), titanium (Ti), or alloys thereof. Each of the conductive vias 143 may be completely filled with the conductive material, or the conductive material may also be formed along a wall of each of the vias, in addition, each of the conductive vias 143 may have any shape known in the related art, such as a tapered shape, a cylindrical shape, and the like.

The electronic connection structures 170 may physically or electrically externally connect the semiconductor package 100. For example, the semiconductor package 100 may be mounted on a mainboard of an electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads P, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
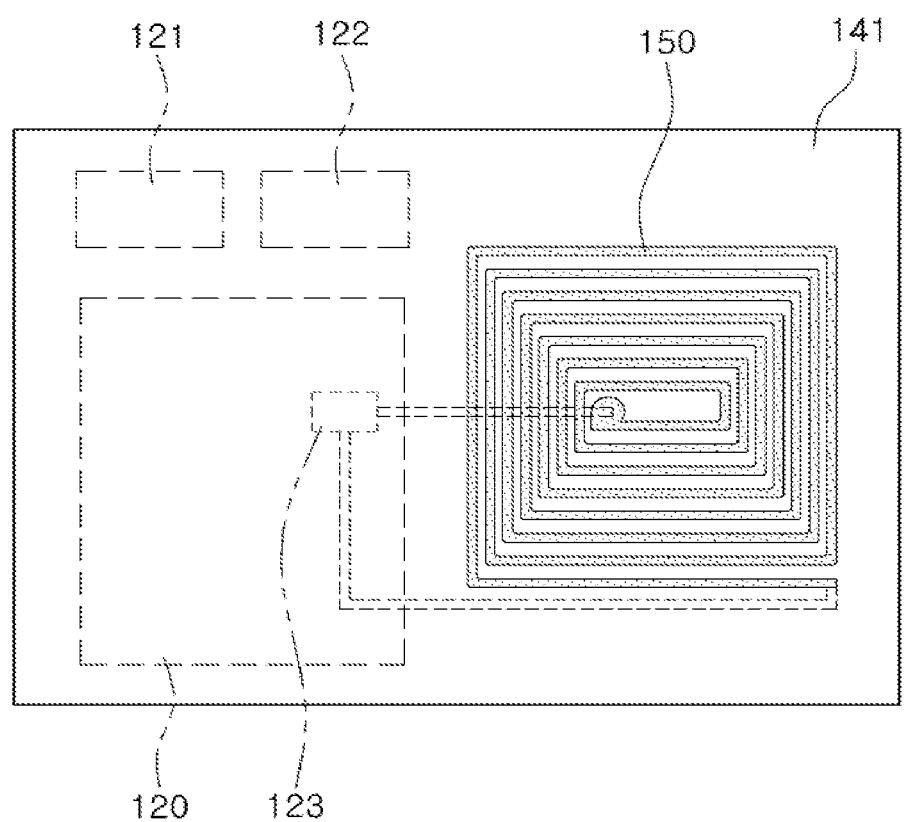
FIGS. 11 through 14 are plan views of an inductance sensing part when viewed from the top.
Figure 12:
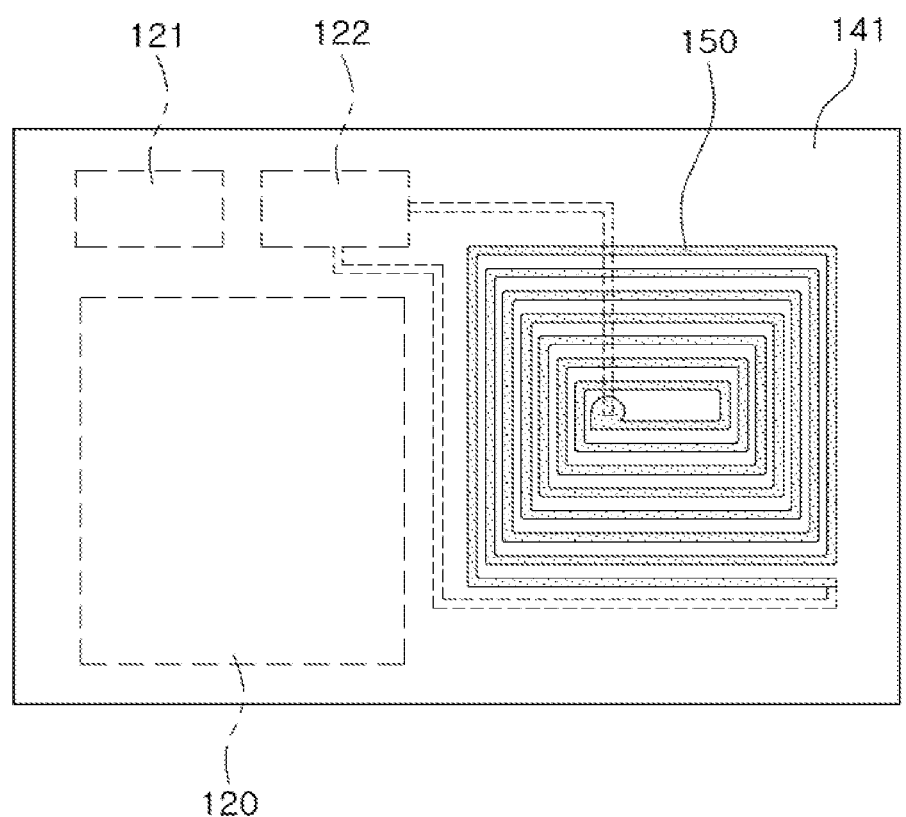

As described above, the inductance sensing part 150 having a coil form may be disposed in the connection member 140. The inductance sensing part. 150 may perform a function of sensing a motion of a magnetic sensing gear 180 depending on a change in magnetic field, when the magnetic sensing gear 180 rotates as in the example of the operation illustrated in FIG. 10, The coil form of the inductance sensing part 150 may be wound in a stacking direction along which the insulating layer and the redistribution layer are stacked. As a more specific example, when turning a knob in a smartwatch or the like, the magnetic sensing gear 120 connected to the knob may rotate and sense a change in inductance to detect an amount of turning of the knob. Information obtained as described above may be provided to the semiconductor chip 120 electrically connected to the inductance sensing part 150, and the semiconductor chip 120 may perform a suitable function depending on a motion of the knob. In detail, as illustrated in FIG. 11, the inductance sensing part 150 may be electrically connected to a capacitor 123 in the semiconductor chip 120 and form an LO circuit, thereby detecting the rotation of the magnetic sensing gear 180. However, the inductance sensing part 150 may not be necessarily connected to the capacitor 123 in the semiconductor chip 120, and may alternatively be connected to a capacitor 122 that is outside of the semiconductor chip 120 as illustrated in FIG. 12. The electrical connection between the inductance sensing part 150 and the semiconductor chip 120 or between the inductance sensing part 150 and the capacitor 122 may be through at least wiring patterns made of the redistribution layers 142.

As the inductance sensing part 150 is integrated with the semiconductor chip 120, the passive devices 121 and 122, and the like in the semiconductor package 100 as in the exemplary embodiment, the semiconductor package may be effectively applied to a smartwatch, or the like, such that module integration and improvement of efficiency of processes may be promoted. Further, when the inductance sensing part 150 is disposed in the connection member 140 corresponding to a redistribution unit, a coil pattern may have a small width. Therefore, the number of turns of the coil pattern in the same area may be increased in comparison to a case in which the coil is manufactured as a PCB type coil. As a result, sensitivity of the inductance sensing part 150 having the coil pattern of which the number of turns is increased may be improved.

As illustrated in the drawings, the inductance sensing part 150 may be formed on the same level as that of the redistribution layers 142 of the connection member 140. In this case, the inductance sensing part 150 may be formed through the same manufacturing process as that of the redistribution layers 142. Patterns of the inductance sensing part 150 may be coplanar with respective redistribution layers 142 of the connection member 140. The inductance sensing part 150 may have a single-layer coil structure in a fine pattern form. In this case, the inductance sensing part 150 may be coplanar with one of the redistribution layers 142 of the connection m-ember 140.

Figure 13:
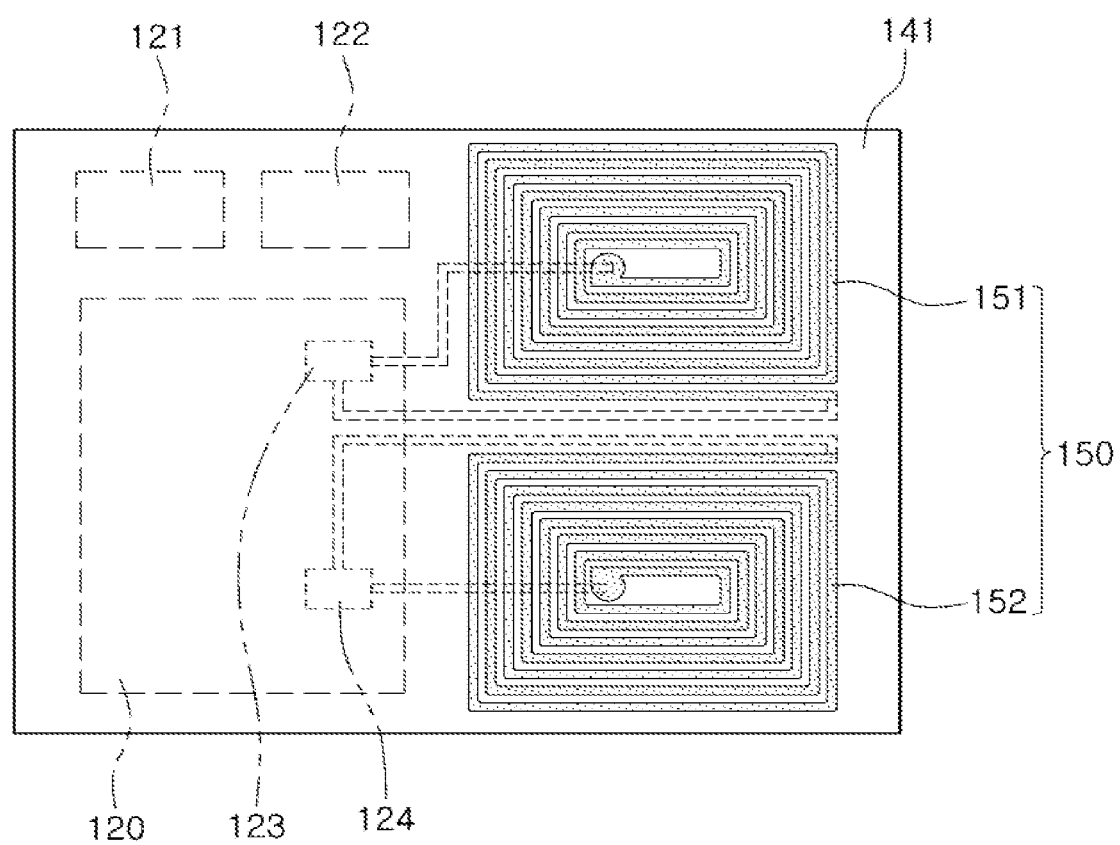
Figure 14:
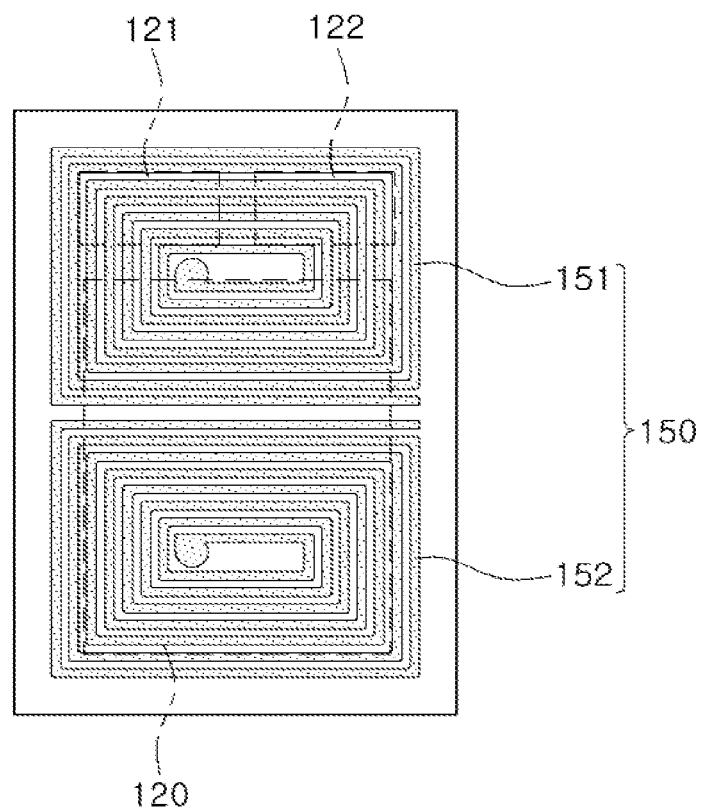

As in a modified example of FIG. 13, the inductance sensing part 150 may include a plurality of coils 151 and 152, and a case in which two coils 151 and 152 are included will be described. The plurality of coils 151 and 152 may be electrically separated from each other and for example, may be connected to a plurality of capacitors 123 and 124 in the semiconductor chip 120, respectively. In this case, a plurality of magnetic sensing gears may also be provided to rotate at positions corresponding to the plurality of coils 151 and 152. When the inductance sensing part 150 includes the plurality of coils 151 and 152, noise may be reduced, such that sensitivity may further be improved. To this end, directions of turns of the plurality of coils 151 and 152 may be different from each other as illustrated in FIG. 13.

Meanwhile, in the exemplary embodiments illustrated in FIGS. 9 to 13, the inductance sensing part 150 may be disposed not to overlap the semiconductor chip 120 in a thickness direction of the insulating layer 141 included in the connection member 140. In this case, the inductance sensing part 150 and the semiconductor chip 120 may be offset from each other in a plan view. Alternatively, as in a modified example of FIG. 14, the inductance sensing part 150 may overlap the semiconductor chip 120 in the thickness direction of the insulating layer 141 included in the connection member 140. The inductance sensing part 150 may also overlap the passive devices 121 and 122 in the thickness direction of the insulating layer 141 included in the connection member 140. The disposition form in which the inductance sensing part 150 overlaps with the semiconductor chip 120 and/or the passive devices 121 and 122 is suitable for miniaturization of the package.

Figure 15:
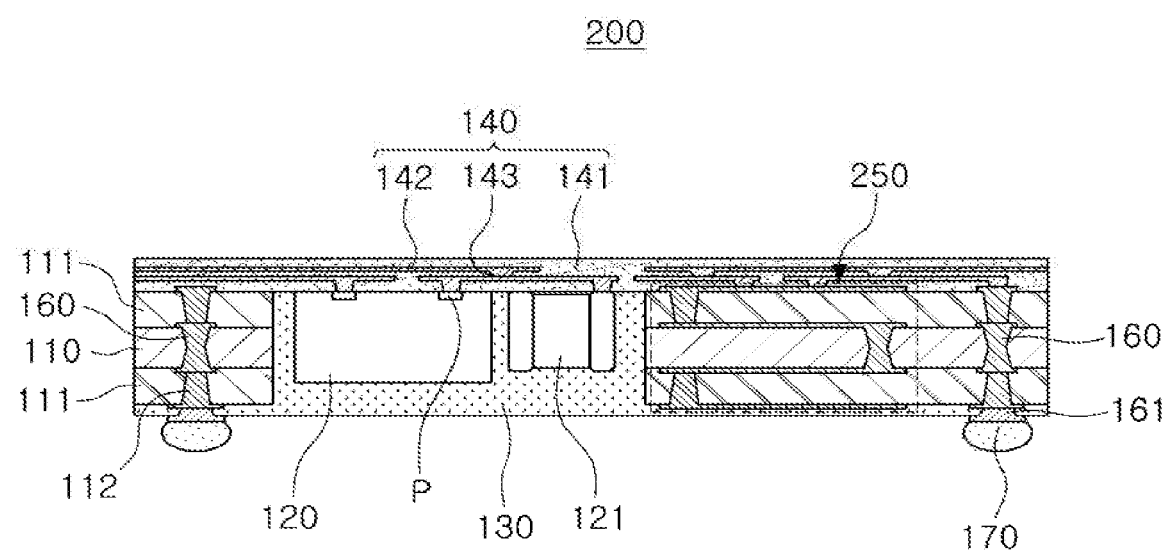
FIG. 15 is a cross-sectional view illustrating a semiconductor package according to another exemplary embodiment in the present disclosure.

FIG. 15 is a cross-sectional view illustrating a semiconductor package according to another exemplary embodiment in the present disclosure. A semiconductor package 200 of the exemplary embodiment is different from that of the above-described exemplary embodiment in terms of a region in which an inductance sensing part 250 is disposed and a form of the inductance sensing part 250, and a description for overlapping components will be omitted.

Referring to FIG. 15, the inductance sensing part 250 of the semiconductor package 200 may be disposed in the core member 110, and may be used in a situation in which it is difficult to secure a sensing region in the connection member 140. The core member 110 may include additional insulating layers 111 disposed at an upper portion and a lower portion of the core member 110, and conductive vias 112 penetrating through the insulating layers 111 in order to implement the inductance sensing part 250 in the core member 110. For example, each of the insulating layers 111 may be a prepreg (PPG) layer, or the like. In this case, as illustrated in FIG. 15, the inductance sensing part 250 may have a multilayer coil structure and be connected to the redistribution layers 142 of the connection member 140.

Meanwhile, the inductance sensing part 150 or 250 is disposed in the connection member 140 or the core member 110 in the exemplary embodiments described above. However, the inductance sensing part 150 or 250 may also be disposed in both of the connection member 140 and the core member 1100, if necessary. In addition, the example in which the inductance sensing part 150 disposed in the connection member 140 has a single-layer coil structure is described in the exemplary embodiment described above. However, the inductance sensing part 150 may also have a multilayer coil structure.

As set forth above, according to the exemplary embodiment in the present disclosure, the semiconductor package including the inductance sensing part of which sensitivity is excellent may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a connection member including an insulating layer and a redistribution layer in the insulating layer;
a semiconductor chip having an active surface on which a connection pad of the semiconductor chip faces to the connection member, the connection pad electrically connected to the redistribution layer;
an encapsulant covering an inactive surface, opposite to the active surface of the semiconductor chip, and side surfaces of the semiconductor chip;
a capacitor disposed in the semiconductor chip or outside of the semiconductor chip; and
an inductance sensing part embedded in the connection member, disposed on the same level as a level on which the redistribution layer is disposed, and having a coil form,
wherein the coil form of the inductance sensing part is a spiral shape in which a coil of the inductance sensing part wound in a direction toward a center of the inductance sensing part when viewed in a plan view,
wherein the inductance sensing part is electrically connected to the capacitor through one end and the other end of the inductance sensing part, and
wherein the inductance sensing part and the capacitor are configured to an LC circuit to detect a number of rotation of a magnetic sensing gear which is disposed on the inductance sensing part.

2. The semiconductor package of claim 1, wherein the coil of the inductance sensing part is wound more than 360 degrees from the one end of the inductance sensing part to the other end of the inductance sensing part based on the center of the inductance sensing part.

3. The semiconductor package of claim 1, wherein the coil of the inductance sensing part is wound more than four or more times from the one end of the inductance sensing part to the other end of the inductance sensing part based on the center of the inductance sensing part.

4. The semiconductor package of claim 1, wherein an outer surface of the coil of the inductance sensing part is completely covered by the insulating layer of the connection member.

5. The semiconductor package of claim 1, wherein the coil of the inductance sensing part is in physical contact with the insulating layer of the connection member.

6. The semiconductor package of claim 1, wherein the inductance sensing part has a single-layer coil structure.

7. The semiconductor package of claim 1, wherein the inductance sensing part is disposed not to overlap the semiconductor chip in a thickness direction of the insulating layer.

8. The semiconductor package of claim 1, wherein the inductance sensing part includes a plurality of coils.

9. The semiconductor package of claim 8, wherein the plurality of coils are electrically separated from each other.

10. The semiconductor package of claim 8, wherein the plurality of coils includes a first coil and a second coil, and
wherein the first coil is disposed on the same level as a level on which the second coil is disposed.

11. The semiconductor package of claim 10, wherein the first coil is wound in a clockwise direction, and the second coil is wound in a counterclockwise direction.

12. The semiconductor package of claim 1, wherein the inductance sensing part has a multilayer coil structure.

13. The semiconductor package of claim 1, further comprising an external electrical connection unit penetrating through the encapsulant and electrically connected to the redistribution layer.

14. The semiconductor package of claim 1, wherein the inductance sensing part and the encapsulant are spaced apart from each other.

15. A semiconductor package, comprising:
a connection member including an insulating layer and a redistribution layer in the insulating layer;
a semiconductor chip having an active surface on which a connection pad of the semiconductor chip faces to the connection member, the connection pad electrically connected to the redistribution layer;
an encapsulant covering an inactive surface, opposite to the active surface of the semiconductor chip, and side surfaces of the semiconductor chip; and
an inductance sensing part embedded in the connection member and having a coil form,
wherein the inductance sensing part overlaps the semiconductor chip in a vertical direction perpendicular to the active surface of the semiconductor chip.

16. The semiconductor package of claim 15, wherein the coil form of the inductance sensing part is a spiral shape in which a coil of the inductance sensing part wound in a direction toward a center of the inductance sensing part when viewed in a plan view, and
wherein the coil of the inductance sensing part is in physical contact with the insulating layer of the connection member.

17. The semiconductor package of claim 15, wherein the coil form of the inductance sensing part is wound more than 360 degrees from one end of the inductance sensing part to the other end of the inductance sensing part based on a center of the inductance sensing part.

18. The semiconductor package of claim 15, wherein the coil form of the inductance sensing part is wound more than four or more times from one end of the inductance sensing part to the other end of the inductance sensing part based on a center of the inductance sensing part.

19. The semiconductor package of claim 15, further comprising:
a capacitor disposed in the semiconductor chip or outside of the semiconductor chip,
wherein the inductance sensing part is embedded in the connection member and disposed on the same level as a level on which the redistribution layer is disposed, and
wherein the inductance sensing part is electrically connected to the capacitor through one end and the other end of the inductance sensing part, and
wherein the inductance sensing part and the capacitor are configured to an LC circuit to detect a number of rotation of a magnetic sensing gear which is disposed on the inductance sensing part.

20. The semiconductor package of claim 15, wherein the inductance sensing part includes a plurality of coils,
- wherein the plurality of coils includes a first coil and a second coil electrically separated from each other,
- wherein the first coil is disposed on the same level as a level on which the second coil is disposed, and
- wherein the first coil is wound in a clockwise direction, and the second coil is wound in a counterclockwise direction.

* * * * *